(12) United States Patent
Akbari-Dilmaghani

(10) Patent No.: US 9,130,528 B2
(45) Date of Patent: Sep. 8, 2015

(54) ELECTRONIC CIRCUIT ARRANGEMENT FOR RECEIVING LOW FREQUENCY ELECTROMAGNETIC WAVES WITH AN ADJUSTABLE ATTENUATOR ELEMENT

(71) Applicant: Maxim Integrated Products, Inc., San Jose, CA (US)

(72) Inventor: Rahim Akbari-Dilmaghani, Graz (AT)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/444,790

(22) Filed: Jul. 28, 2014

(65) Prior Publication Data

US 2015/0011171 A1 Jan. 8, 2015

Related U.S. Application Data

(63) Continuation of application No. 13/885,039, filed as application No. PCT/EP2011/067018 on Sep. 29, 2011, now Pat. No. 8,792,844.

(30) Foreign Application Priority Data

Nov. 17, 2010 (DE) .......................... 10 2010 044 028

(51) Int. Cl.
| | |
|---|---|
| *H04B 5/00* | (2006.01) |
| *H03G 3/22* | (2006.01) |
| *G06K 7/00* | (2006.01) |
| *G06K 19/07* | (2006.01) |
| *G06K 19/077* | (2006.01) |
| *H04B 1/12* | (2006.01) |
| *H04B 7/08* | (2006.01) |

(52) U.S. Cl.
CPC ................ *H03G 3/22* (2013.01); *G06K 7/0008* (2013.01); *G06K 19/0715* (2013.01); *G06K 19/07749* (2013.01); *H04B 1/12* (2013.01); *H04B 7/0871* (2013.01)

(58) Field of Classification Search
CPC ....... H04B 7/0871; G06K 7/0008; H03G 3/22
USPC ......... 455/41.1, 41.2, 553.1, 130, 249.1, 264, 455/262
See application file for complete search history.

(56) References Cited

U.S. PATENT DOCUMENTS 4,868,571 A * 9/1989 Inamasu ....................... 341/118
6,316,975 B1 11/2001 O'Toole
(Continued)

FOREIGN PATENT DOCUMENTS

| CN | 101145811 A | 3/2008 |
|---|---|---|
| WO | 2009058778 A2 | 5/2009 |
| WO | WO2009/058778 A2 | 5/2009 |

OTHER PUBLICATIONS

International Search Report dated May 30, 2013, in related related International Application No. PCT/EP2011/067018.
Written Opinion dated May 30, 2013, in related related International Application No. PCT/EP2011/067018.
(Continued)

*Primary Examiner* — Tuan Pham
(74) *Attorney, Agent, or Firm* — North Weber & Baugh LLP

(57) ABSTRACT

An electronic circuit arrangement for receiving low-frequency electromagnetic waves is proposed, having an inductor (L) acting as an antenna for generating a received signal, having a first receiver (2), connected to the inductor (L), for decoding a first component of the received signal and having a second receiver (3), connected to the inductor (L), for decoding a second component of the received signal, wherein at least the second receiver (3) is connected to the inductor (L) via an attenuator element (4) having adjustable attenuation, wherein at least one adjustment signal generation circuit (5, 6) is provided for generating an adjustment signal corresponding to a voltage of the received signal which is fed to the attenuator element (4) for adjusting the attenuation.

13 Claims, 1 Drawing Sheet

(56) References Cited

U.S. PATENT DOCUMENTS

2008/0076351 A1* 3/2008 Washiro ........................ 455/41.1
2008/0117027 A1* 5/2008 Tsirline et al. ............... 340/10.6

OTHER PUBLICATIONS

Office Action dated Apr. 9, 2015, in related Chinese Patent Application No. 201180060831.2 (13pgs).

* cited by examiner

ELECTRONIC CIRCUIT ARRANGEMENT FOR RECEIVING LOW FREQUENCY ELECTROMAGNETIC WAVES WITH AN ADJUSTABLE ATTENUATOR ELEMENT

CROSS REFERENCE TO RELATED APPLICATIONS

This application is a continuation of copending application Ser. No. 13/885,039, filed May 13, 2013, now U.S. Pat. No. 8,792,844, issued Jul. 29, 2014, which is the national phase application under 35 U.S.C. §371 of International Application No. PCT/EP2011/067018, filed Sep. 29, 2011, which claims priority to German Patent Application 102010044 028.0, filed Nov. 17, 2010, which applications and patents are hereby incorporated herein by reference in their entireties and from which applications and patents priority is hereby claimed.

BACKGROUND

A. Technical Field

The present invention relates to an electronic circuit arrangement for receiving low frequency electromagnetic waves, having an inductor acting as an antenna for generating a low frequency receive signal, having a first receiver connected to the inductor for decoding a first component of the receive signal and having a second receiver connected to the inductor for decoding a second component of the receive signal.

B. Background of the Invention

From current practice an electronic circuit arrangement for receiving low frequency electromagnetic waves is known, having an inductor acting as an antenna that generates a low frequency electrical receive signal, corresponding to the received electromagnetic waves, that is fed to a plurality of differently designed receivers for decoding, so that only one inductor is necessary for a plurality of receivers. Decoding is understood here to be processing of the receive signal so that useful information can be extracted. In this case, the receivers can be built so that each of them processes a specific component of the receive signal. In this manner, a significant space saving can be obtained compared to solutions in which each receiver has its own antenna. This applies particularly in the low frequency range, which is understood to be a frequency range from 20 kHz to 250 kHz, because the inductors suited for this range have a considerable size.

However, if the components of the receive signal to be processed by the different receivers have very different voltage values, it is possible that the voltage resistance of one of the receivers is such low that it is damaged by the component of the receive signal intended for another receiver. This can occur in particular when the components trace back to different transmitting devices.

SUMMARY OF THE INVENTION

The object of the invention is to provide an electronic circuit arrangement of the named type in which the risk of damaging one of its receivers is reduced.

The object is attained with an electronic circuit arrangement of the initially named type in which at least the second receiver is connected to the inductor via an attenuator element having adjustable attenuation, wherein at least one adjustment signal generation circuit is provided for generating an adjustment signal that corresponds to the voltage of the receive signal and that is fed to the attenuator element for adjusting the attenuation.

Here, an attenuator element is understood to be an element which reduces, in an essentially frequency independent manner, the voltage of the received electrical signal that is fed to it, and thus generates an attenuated receive signal that contains essentially the same informational content. The attenuation of the attenuator element is adjustable and specifies the level of the attenuation of the receive signal. It can be expressed in decibels, for example.

It is provided that an adjustment signal is generated by means of an adjustment signal generation circuit, and that this generated signal corresponds to the voltage of the receive signal. The adjustment signal is fed to the attenuator element so that its attenuation varies depending on the voltage of the receive signal, wherein in particular, the attenuation also increases with increasing voltage.

Damage to the second receiver by voltages that are too high can now be effectively avoided by at least the second receiver, in particular a receiver having a higher sensitivity and/or having a lower voltage resistance than the first receiver, being loaded via the attenuator element with an attenuated receive signal. In particular, components of the receive signal that have a high voltage and that are provided for decoding by the first receiver cannot thus cause any damage, because at their input the attenuation can be adjusted to be sufficiently high that the voltage of the receive signal is not harmful.

If, on the other hand, a component of the receive signal is present that is provided for decoding by the second receiver and in particular has a low voltage, the attenuation can be reduced so that decoding the receive signal is still possible. The overall sensitivity of the second receiver is therefore essentially maintained.

One of the receivers, or both receivers, can have differential inputs. A differential input is understood to be a two-pole input whose two poles are connected neither to a positive nor to a negative supply potential of a supply voltage supplying the circuit. In the context of the present application, "connected to" is understood to be "electrically conductively connected", unless specified otherwise.

According to an advantageous further development of the invention, the electronic circuit arrangement is implemented as a CMOS integrated circuit. A particularly reliable and space saving construction can be realized in this manner.

An integrated circuit is understood to be an electronic circuit comprising a plurality of electronic components and the associated wiring that are implemented on a common substrate, also called a chip. A fully integrated design can be provided in which all electronic components are disposed on exactly one substrate.

Furthermore, the circuit according to the invention is manufactured in CMOS technology, where it is understood that PMOS transistors, also called p-channel metal oxide semiconductor transistors, as well as NMOS transistors, also called n-channel metal oxide semiconductor transistors, can be disposed on a common substrate.

According to an advantageous further development of the invention, the first receiver is a transponder that generates from the receive signal a response signal that can be emitted via the inductor. The transponder can be a component of an RFID system, which performs automatic identification, in particular, of people as part of an access control process, for example, in a motor vehicle. For example, a reading device disposed on a motor vehicle can emit an query signal that is decoded by the first receiver and is responded to with the indication of an identity. If a permitted identity is sent, the vehicle can then be opened.

In particular, when the first receiver is an RFID transponder, the advantages of the invention become evident, because here the voltage of the receive signal generated by the query signal depends strongly on the changing distance between the reading device and the electronic circuit. In practice, such a system is designed so that it can have an operating range of several meters. At the same time however, it cannot be excluded that the actual distance only amounts to a few centimeters. The receive signal can then attain such a large voltage that in principle, it could damage, in particular, the second receiver. However, this is effectively avoided by the design of the circuit according to the invention. Although known RFID transponders are sufficiently voltage stable in order to withstand the possible voltages of the receive signal, it is in principle also possible to protect the first receiver with an attenuator element of the described type.

According to an expedient further development of the invention, the transponder is a passive transponder. Passive transponders obtain the energy required for their operation from the query signal which is especially powerful for this purpose. Specifically in this case, damage to the second receiver can be avoided.

According to an advantageous further development of the invention, the second receiver is a wake-up receiver that, depending on the receive signal, switches an electronic component that is in standby mode into an operating mode. A wake-up receiver is understood to be a receiver that upon receipt of a predefined signal switches an electronic component, for example a transmitter, from standby mode into operating mode. In this manner, the energy consumption of the electronic component is significantly reduced when it is not required, that is, in particular, before receipt of the predefined signal. In this case, the predefined signal can be emitted by a so-called wake-up transmitter, wherein it should be received at large distances even if the transmitter has low power. Therefore, wake-up receivers are typically designed for decoding receive signals that have a lower voltage than is typical in RFID transponders. At the same time, wake-up receivers are as a rule less voltage-resistant than RFID transponders. For example, the voltage resistance of a wake-up receiver can amount to a few hundred millivolts, whereas the voltage resistance of the RFID transponder can amount to a few volts. Therefore, the circuit according to the invention is particularly advantageous when it comprises an RFID transponder and a wake-up receiver protected by the attenuator element.

According to an advantageous further development of the invention, the adjustment signal generation circuit comprises a voltage limiter for limiting the voltage of the adjustment signal. A voltage limiter is generally understood to be an electronic component that reduces the voltage if it exceeds a defined threshold value. In this manner, even in the case of a particularly high voltage of the receive signal, damage to the attenuator element and/or other components of the circuit can be avoided by means of the adjustment signal.

According to an advantageous further development of the invention the adjustment signal generation circuit comprises a rectifier circuit for rectifying the receive signal. By means of this, an adjustment signal that is suitable for adjusting the attenuation of the attenuator element can be generated in a simple manner.

According to an advantageous further development of the invention, the rectifier circuit has at least one MOS transistor, in particular an NMOS transistor, in which a gate terminal is connected with low impedance to a drain terminal, so that it functions as a diode. In this manner, the rectifier circuit can be implemented as a compact integrated CMOS circuit that is particularly simple to produce.

According to an advantageous further development of the invention, the attenuator element has a symmetrical voltage divider circuit, in which a first side of the inductor is connected via a first capacitor, a second capacitor and via a first component arrangement having at least one active electronic component to a ground potential, wherein a second side of the inductor is connected via a third capacitor, a fourth capacitor and via a second component arrangement having at least one active electronic component to a ground potential, wherein the attenuated receive signal is tapped between the sides of the first capacitor and the third capacitor that face away from the inductor. In this context, an active electronic component is understood to be an electronic component which depending on its wiring has an amplification and/or control function.

The voltage of the attenuated receive signal tapped between first and second capacitor and between the third and fourth capacitor, depends on the complex resistivity of the first and second component arrangements. This complex resistivity can be adjusted by the adjustment signal so that the voltage of the attenuated receive signal lies in a safe range.

Due to the symmetrical design, especially relative to ground, of the voltage divider, which in particular can mean that the first and the third capacitor, the second and the fourth capacitor, as well as the first and the second component arrangement are identical to each other, it is possible to feed the attenuated receive signal directly to the differential input of the second receiver.

According to an advantageous further development of the invention, the active electronic components are MOS transistors, in particular NMOS transistors. As a result, the attenuator element can be implemented as an integrated CMOS circuit that is particularly compact and easy to produce.

According to an advantageous further development of the invention the adjustment signal is fed to at least one pair formed from a said active electronic component of the first component arrangement and a said active electronic component of the second component arrangement. As a result, it can be attained in a simple manner that the attenuated receive signal is symmetrical with respect to the ground potential, independently of the respective adjusted attenuation.

According to an advantageous further development of the invention, the attenuator element has a first said pair for attenuating the receive signal in a first voltage range, and a second said pair for additional attenuation of the receive signal in a second, higher voltage range. For this, the receive signal is attenuated using two separately controllable pairs of active components, which means that the voltage range, in which the voltage of the receive signal can be reduced to a permissible value, can be very large. With this design, the adjustment accuracy can be improved in the entire voltage range.

According to an advantageous further development of the invention a first said adjustment signal generation circuit for generating a first said adjustment signal is fed to the first said pair and a second said adjustment signal generation circuit for generating a second set adjustment signal, which is fed to the second said pair. Thereby, the first adjustment signal as well as the second adjustment signal is generated such that it is optimally matched to the electrical properties of the respective pair of active elements. Thereby, the adjustment accuracy of the attenuation can be improved in the entire voltage range so that both over-attenuation as well as under-attenuation can be avoided.

According to an advantageous further development of the invention the first said adjustment signal generation circuit comprises a rectifier circuit designed as a half-wave rectifier circuit. The adjustment signal generation circuit can be implemented very easily this way.

According to an advantageous further development of the invention the second said adjustment signal generation circuit comprises a rectifier circuit designed as a full-wave rectifier circuit. Thereby, both half-waves of a period of the receive signal can be considered when generating the adjustment signal.

According to a further advantageous development of the invention, the full-wave rectifier circuit is employed for generating a supply voltage for the passive transponder. In this manner, the full-wave rectifier can be used simultaneously for multiple purposes, which overall simplifies the design of the circuit.

The advantageous embodiments and further developments of the invention described in the preceding and/or specified in the dependent claims, can—except for example, in the cases of explicit dependencies or incompatible alternatives—be used individually or also in any arbitrary combination with each other.

BRIEF DESCRIPTION OF THE DRAWINGS

The invention and its advantageous embodiments and further developments and their advantages are described in more detail in the following based on drawings. They show.

DETAILED DESCRIPTION OF THE PREFERRED EMBODIMENTS

Figure 1:
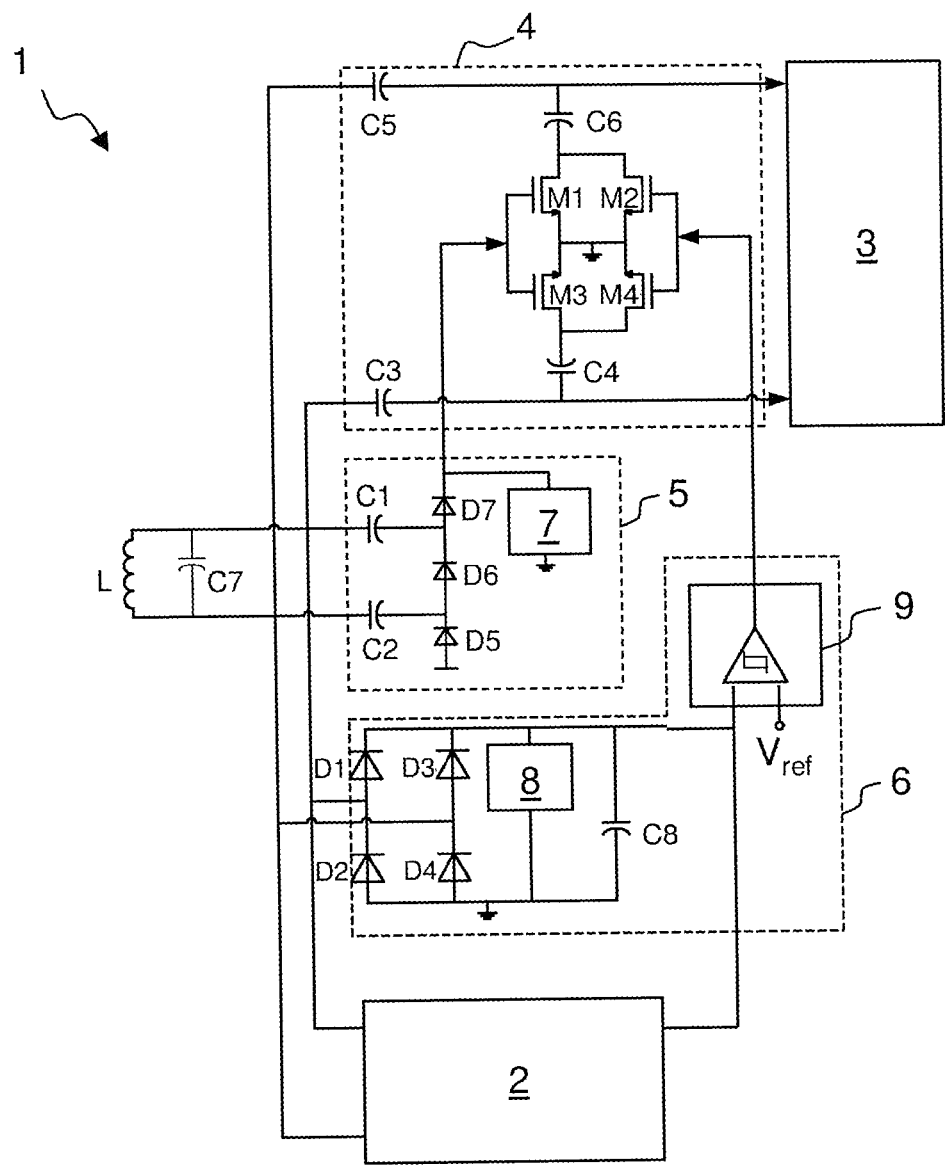
FIG. 1 is a schematic circuit diagram of an exemplary embodiment of the electronic circuit according to the invention, and, FIG. 2 is an exemplary embodiment of the diodes of the electronic circuit from FIG. 1.

FIG. 1 shows an exemplary embodiment of the electronic circuit 1 according to the invention that is designed for receiving low-frequency electromagnetic waves. The circuit 1 according to the invention is designed in an integrated construction, that is, as an integrated circuit, which is understood to mean that a plurality of electronic components and an associated wiring of the circuit 1 are implemented on a common substrate, also called a chip. Here, a fully integrated construction can be provided in which all electronic components of the circuit are disposed on exactly one substrate.

Furthermore, the circuit 1 according to the invention is manufactured in CMOS technology, that is, a technology in which both PMOS transistors, also called p-channel metal oxide semiconductor transistors, as well as NMOS transistors, also called n-channel metal oxide semiconductor transistors, can be disposed on a common substrate.

The circuit 1 according to the invention has an inductor L, acting as an antenna, that together with a capacitor C7 forms an oscillator circuit. The oscil-lator circuit can have a resonance frequency, in particular, in the range of 20 kHz to 250 kHz. Using the oscillator circuit, received electromagnetic waves can be converted into an electrical receive signal that is fed via electrical conductors directly to a first receiver 2. In the exemplary embodiment, the first receiver 2 is a passive transponder 2 that generates a response signal, depending on the input signal, that can be emitted via the inductor L. The transponder 2 can be a component of an RFID system, which provides an automatic identification, in particular, of people, as part of an access control process, for example, in a motor vehicle. In the exemplary embodiment, the RFID transponder 2 has a differential input for the received input.

Furthermore, a second receiver 3 is provided that is implemented as a wake-up receiver 3. A wake-up receiver 3 is understood to be a receiver which, upon receipt of a predefined signal, switches an electronic component, for example a transmitter, from a standby mode into an operating mode. In this manner, the energy consumption of the electronic component is greatly reduced when it is not needed, that is, in particular, before receipt of the predefined signal. In this context, the predefined signal can be emitted from a so-called wake-up transmitter, where it should be received at great distances even if the transmitter has low power. Therefore, wake-up receivers 3 are typically designed for decoding receive signals that have a lower voltage than is typical in RFID transponders 2. At the same time, wake-up receivers 3 are as a rule less voltage-resistant than RFID transponders 2. For example, the voltage resistance of a wake-up receiver 3 can amount to a few hundred millivolts, whereas the voltage resistance of the RFID transponder 2 can amount to a few volts.

To prevent damage to the wake-up receiver 3 by a receive signal voltage that is too high, an attenuator element 4 is provided with an adjustable attenuation. Here, an attenuator element 4 is understood to be an element which reduces, essentially independently of frequency, the voltage of the electrical receive signal that is fed to it, and so generates an attenuated receive signal that is fed to a differential input of the wake-up receiver 3. The attenuation of the attenuator element 4 specifies the level of the attenuation of the receive signal.

In the exemplary embodiment, the attenuator element 4 has a symmetrical voltage divider circuit C3, C4, C5, C6, M1, M2, M3, M4 in which a first side of the inductor L is connected via a first capacitor C3, a second capacitor C4 and via a first component arrangement M3, M4 having two active electronic components M3, M4, to the ground potential, wherein a second side of the inductor L is connected via a third capacitor C5, a fourth capacitor C6 and via a second component arrangement M1, M2 having two further active electronic components M1, M2, to a ground potential. Here, the attenuated receive signal is tapped between the sides of the first capacitor C3 and the third capacitor C5 facing away from the inductor L.

The voltage of the attenuated receive signal tapped between the first capacitor C3 and the second capacitor C4, as well as between the third capacitor C5 and the fourth capacitor C6, depends on the complex resistivity of the first component arrangement M3, M4 and the second component arrangement M1, M2. These complex resistivitities can be adjusted here by a first adjustment signal, which is generated by the first adjustment signal creation circuit 5, and by a second adjustment signal, which is generated by a second adjustment signal generation circuit 6, so that the voltage of the attenuated receive signal lies in a harmless range.

Due to the symmetrical design, especially relative to ground, of the voltage divider C3, C4, C5, C6, M1, M2, M3, M4, which in particular can mean that the first capacitor C3 and the third capacitor C5, the second capacitor C4 and the fourth capacitor C6, as well as the first component arrangement M3, M4 and the second component arrangement M1, M2 each correspond to each other, it is possible, to lead the attenuated receive signal directly to the differential input of the second receiver 3.

The active electronic components M1, M2, M3, M4 of the attenuator element 4 are implemented in this exemplary embodiment as MOS transistors M1, M2, M3, M4, in particular NMOS transistors M1, M2, M3, M4.

In the exemplary embodiment, the first adjustment signal is fed to the active electronic component M3 of the first component arrangement M3, M4 and to the active electronic component M1 of the second component arrangement M1, M2.

The jointly controlled active electronic components M1 and M3 form a pair of active electronic components M1, M3 for damping the receive signal in a first voltage range.

In the exemplary embodiment, the second adjustment signal is fed to the active electronic component M4 of the first component arrangement M3, M4, and to the active electronic component M2 of the second component arrangement M1, M2.

The jointly controlled active electronic components M2 and M4 form a second pair of active electronic components M1, M3 for additional damping of the receive signal in a second, higher voltage range.

In this manner, the receive signal is attenuated by the use of two separate controllable pairs M1, M3, M2, M4 of active components M1, M3, M2, M4, whereby the voltage range, in which the voltage of the receive signal can be reduced to a permissible value, can be very large.

By using two adjustment signal generation circuits 5, 6, both the first adjustment signal and a second adjustment signal can be generated so that they are optimally matched with respect to the electrical properties of the respective pairs M1, M3, M2, M4 of active elements M1, M3, M2, M4. Due to this, the adjustment accuracy of the attenuation can be improved in the entire voltage range so that both under-attenuation as well as over-attenuation can be avoided.

Due to the symmetrical pairwise arrangement and control of the active components M1, M3, M2, M4 it can be attained in a simple manner that the attenuated receive signal is symmetrical with respect to the ground potential, independently of the respective adjusted attenuation.

The first adjustment signal generation circuit 5 has a differential input for the receive signal, which is connected by two capacitors C1 and C2 to the half-wave rectifier circuit D5, D6, D7. The half-wave rectifier circuit D5, D6, D7 is comprised of a series connection of three diodes D5, D6, D7, wherein the capacitor C1 is connected to a first connection of diodes D6 and D7. Furthermore, the capacitor C2 is connected to a second connection of diodes D5 and D6. The first adjustment signal is tapped here at one end of the series connection D5, D6, D7, whereas the other end of the series connection D5, D6, D7 is connected to a ground potential. The voltage of the first adjustment signal is limited here with respect to ground by a voltage limiter 7.

The second adjustment signal generation circuit 6 has a differential input for the receive signal that is connected directly to a full-wave rectifier circuit D1, D2, D3, D4. The full-wave rectifier circuit D5, D6, D7 is composed of four diodes D1, D2, D3, D4 which form a bridge circuit. The voltage of the rectified receive signal is smoothed by means of a capacitor C8, and is limited by means of a voltage limiter 8. The rectified receive signal is fed to the transponder 2 as a supply voltage, and to the voltage detector 9, wherein the latter generates the second adjustment signal from the rectified receive signal.

Figure 2:
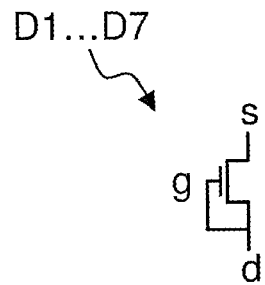

FIG. 2 shows an exemplary embodiment of the diodes D1 to D7 of the electronic circuit of FIG. 1. Here, the diodes D1 to D7 are each comprised of a MOS transistor, in particular, an NMOS transistor, in which a gate is connected with low impedance to a drain so that it acts as a common bipolar diode. In this manner, the rectifier circuits D1, D2, D3, D4, D5, D6, D7 can be implemented as integrated CMOS circuits that are compact and particularly simple to produce.

REFERENCE LIST

1 Electronic Circuit Arrangement
2 First Receiver
3 Second Receiver
4 Attenuator Element
5 First Adjustment Signal Generation Circuit
6 Second Adjustment Signal Generation Circuit
7 Voltage Limiter
8 Voltage Limiter
9 Voltage Detector
L Inductor
C1 . . . C8 Capacitor
D1 . . . D7 Diode
M1 . . . M4 Active Electronic Component, NMOS Transistor
   d Drain Terminal
g Gate Terminal
s Source-Terminal
Vref Reference Voltage

What is claimed is:

1. An electronic circuit comprising:
an antenna that receives a wireless signal and outputs an encoded signal;
a first decoder coupled to receive at least a first portion of the first encoded signal, the first decoder decodes a first component of the encoded signal;
a second decoder coupled to receive at least a second portion of the first encoded signal, the second decoder decodes a second component of the encoded signal and switches the electronic circuit between a standby mode and an operating mode, the second decoder operating at a lower voltage level than the first decoder; and
an attenuator element coupled between the antenna and the second decoder, the attenuator element determines if the at least second portion of the first encoded signal is above a voltage threshold and reduces a voltage level on the at least one second portion of the first encoded signal if the voltage threshold is exceeded.

2. The electronic circuit according to claim 1 wherein the attenuator element comprises a voltage divider having a plurality of voltage reduction steps that can reduce the at least second portion of the first encoded signal below the voltage threshold.

3. The electronic circuit according to claim 2 wherein the voltage divider is symmetrical relative to ground.

4. The electronic circuit according to claim 2 wherein the voltage divider is differential.

5. The electronic circuit according to claim 2 wherein the attenuator element comprises a voltage rectifier for rectifying the at least second portion of the first encoded signal.

6. The electronic circuit according to claim 5 wherein the voltage rectifier has at least one MOS transistor in which a gate is coupled with a low impedance to a drain.

7. The electronic circuit according to claim 1 wherein the antenna comprises an inductor.

8. The electronic circuit according to claim 7 wherein the attenuator element comprises a symmetrical voltage divider circuit, in which a first side of the antenna is coupled via a first capacitor, a second capacitor and via a first transistor and a second transistor to ground potential, a second side of the inductor is coupled via a third capacitor, a fourth capacitor and via a third transistor and a fourth transistor ground.

9. The electronic circuit according to claim 8 wherein the attenuator element taps the at least second portion of the first encoded signal between the first capacitor and the third capacitor.

10. An electronic circuit comprising:
an antenna that receives a wireless signal and outputs an encoded signal;
a first decoder coupled to receive at least a first portion of the first encoded signal, the first decoder decodes a first component of the encoded signal;
a sensor coupled to sense a voltage level at the antenna, the sensor generates at least a second portion of the first encoded signal;
a second decoder coupled to receive the at least second portion of the first encoded signal, the second decoder decodes a second component of the encoded signal and switches the electronic circuit between a standby mode and an operating mode, the second decoder operating at a lower voltage level than the first decoder;
a rectifier coupled to receive the decoded second component of the encoded signal and generates a rectified signal; and
an attenuator element coupled between the antenna and the second decoder, the attenuator element determines if the at least second portion of the first encoded signal is above a voltage threshold and reduces a voltage level on the at least one second portion of the first encoded signal if the voltage threshold is exceeded.

11. The electronic circuit according to claim 10 wherein the rectifier is a half-wave rectifier circuit.

12. The electronic circuit according to claim 10 wherein the rectifier is a full-wave rectifier circuit.

13. The electronic circuit according to claim 10 further comprising a controller coupled to the first decoder and the second decoder, the controller controls a voltage level for the voltage threshold.

* * * * *